United States Patent
Iannuzzi

(10) Patent No.: US 7,027,940 B2
(45) Date of Patent: Apr. 11, 2006

(54) STEPPED SINE WAVE FREQUENCY RESPONSE MEASUREMENT SYSTEM

(76) Inventor: John F. Iannuzzi, 100 Sunrise Dr., North Wales, PA (US) 19454

( * ) Notice: Subject to any disclaimer, the term of this patent is extended or adjusted under 35 U.S.C. 154(b) by 53 days.

(21) Appl. No.: 10/640,235

(22) Filed: Aug. 13, 2003

(65) Prior Publication Data

US 2004/0034486 A1 Feb. 19, 2004

Related U.S. Application Data

(60) Provisional application No. 60/403,017, filed on Aug. 13, 2002.

(51) Int. Cl.
*G06F 19/00* (2006.01)
(52) U.S. Cl. .................. 702/66; 702/77; 702/124; 324/76.19; 324/312; 73/659; 342/192; 455/295; 714/750
(58) Field of Classification Search ............ 702/66, 702/76–77, 79–80, 89, 124, FOR. 117; 324/76.19, 324/312; 73/659; 342/192; 455/295; 714/750
See application file for complete search history.

(56) References Cited

U.S. PATENT DOCUMENTS

| | | | | |
|---|---|---|---|---|
| 4,630,217 A | | 12/1986 | Smith et al. ................ | 702/124 |
| 4,648,060 A | | 3/1987 | Allen et al. ................ | 708/845 |
| 5,162,723 A | * | 11/1992 | Marzalek et al. ........ | 324/76.19 |
| 5,673,272 A | | 9/1997 | Proskauer et al. .......... | 714/724 |
| 5,768,155 A | * | 6/1998 | Becker ....................... | 702/190 |
| 6,236,371 B1 | | 5/2001 | Beck ........................... | 343/703 |
| 6,329,805 B1 | | 12/2001 | Bracht et al. ............ | 324/76.12 |
| 2001/0007151 A1 | * | 7/2001 | Vorenkamp et al. ........ | 725/151 |

OTHER PUBLICATIONS

Spencer et al., 'A Spectrum Analyzer Laboratory Project', Aug. 1993, IEEE Article, vol. 36, No. 3, pp. 301-306.*
Whitaker, 'Spectrum Analysis: Introduction, Principles of Operation- Applications—Spurious Harmonic Distortion', Jan. 2002, CRC Press LLC, pp. 1-11.*
International Search Report, dated Mar. 31, 2004, issued in corresponding PCT Application No. PCT/US03/25485.

* cited by examiner

*Primary Examiner*—Marc S. Hoff
*Assistant Examiner*—Elias Desta
(74) *Attorney, Agent, or Firm*—Mark D. Simpson; Synnestvedt & Lechner LLP

(57) ABSTRACT

A low cost, low power and lightweight swept sine wave analysis system that is affordable to engineers, university laboratories and students, providing accurate magnitude and phase response measurements over a wide bandwidth is described. An analog mixer mixes a local oscillator signal with an amplified input signal allowing AC signal coupling between input stages. This minimizes errors due to DC and low frequency drift. A computer graphical interface is used for controlling the acquisition hardware in real time, displaying results on the computer screen, and making the graphical results and numerical results immediately available for inclusion in documentation or spreadsheet applications.

4 Claims, 4 Drawing Sheets

STEPPED SINE WAVE FREQUENCY RESPONSE MEASUREMENT SYSTEM

CROSS-REFERENCE TO RELATED APPLICATIONS

This application is based on and claims priority to U.S. Provisional Application No. 60/403,017, filed Aug. 13, 2002, incorporated fully herein by reference.

BACKGROUND OF THE INVENTION

A swept sine wave analyzer or network analyzer is typically used to measure the frequency response or transfer function of a circuit or device under test (DUT). A spectrally pure swept sine wave stimulus is injected into the circuit or DUT. The measurement is made by monitoring two signal points at the DUT. One signal point serves as the input and the other serves as the output. The DUT response at each frequency is measured and stored. This continues for a predetermined number of steps over a predetermined frequency range. Calculations are performed on the results of this sequence of measurements to yield the frequency response or transfer function of the DUT.

Various electronics industries use analyzers such as the one described above to characterize their systems. Some example devices or systems include audio amplifiers, power supply controls, radio frequency amplifiers, motor controllers and any circuit or system where it is important to characterize frequency response.

Frequency response measurements are necessary in audio amplifiers so as to characterize their gain uniformity or flatness over all frequencies of the audio bandwidth. Power supply and motor control circuits that utilize feedback for precise regulation utilize magnitude and phase measurements to indicate the degree of control loop stability. Those involved with digital signal processing rely on frequency response measurements to yield transfer functions of the analog systems they are replicating digitally such as IR/FIR filters, hilbert transformers, integrators, differentiators, waveform generators and other systems.

Commercial analyzers are fairly expensive and, in most cases, out of the price range for many electronic designers and companies that could otherwise benefit from testing the frequency response of their systems. The high price also excludes most private contract design engineers, university laboratories, students and electronics hobbyists from being able to have access to them.

Another drawback of commercially available analyzers is that they are stand alone devices without a standard way of connection to a computer. Consequently, the transfer of information to a computer is cumbersome and may require any one of or a combination of the following:
  special programming skill of the operator,
  custom cabling,
  interface card installed in the computer,
  purchase of additional software for control and data analysis,
  manually saving the test data to a floppy disk located on the analyzer for transfer to a computer. After being saved, the data from the floppy is loaded into an application running on the computer.
This involves unnecessary steps for the engineer or researcher who would like the data readily available to incorporate into their documentation or data analysis applications.

SUMMARY OF THE INVENTION

The present invention instrument is a swept sine wave analysis system that provides accurate frequency response measurements over a wide bandwidth and is affordable to engineers, university laboratories, students and hobbyists. Features of the invention include:
  low cost, low power, lightweight and portable acquisition hardware,
  use of standard oscilloscope probes,
  high quality digitally synthesized sine wave stimulus source,
  use of standard communications protocol, RS-232, Universal Serial Bus, Ethernet,
  complete software control and data transfer via personal computer,
  computer graphical interface for controlling the analyzer and displaying results on computer screen,
  data and graphic display readily available for including in documentation or spreadsheet applications,
  ability to save the parameters and data of the entire test.
  No additional internal personal computer hardware, such as a data acquisition card, is needed, and there is no need to purchase additional data analysis or control software.

DETAILED DESCRIPTION OF THE PREFERRED EMBODIMENTS

Figure 1:
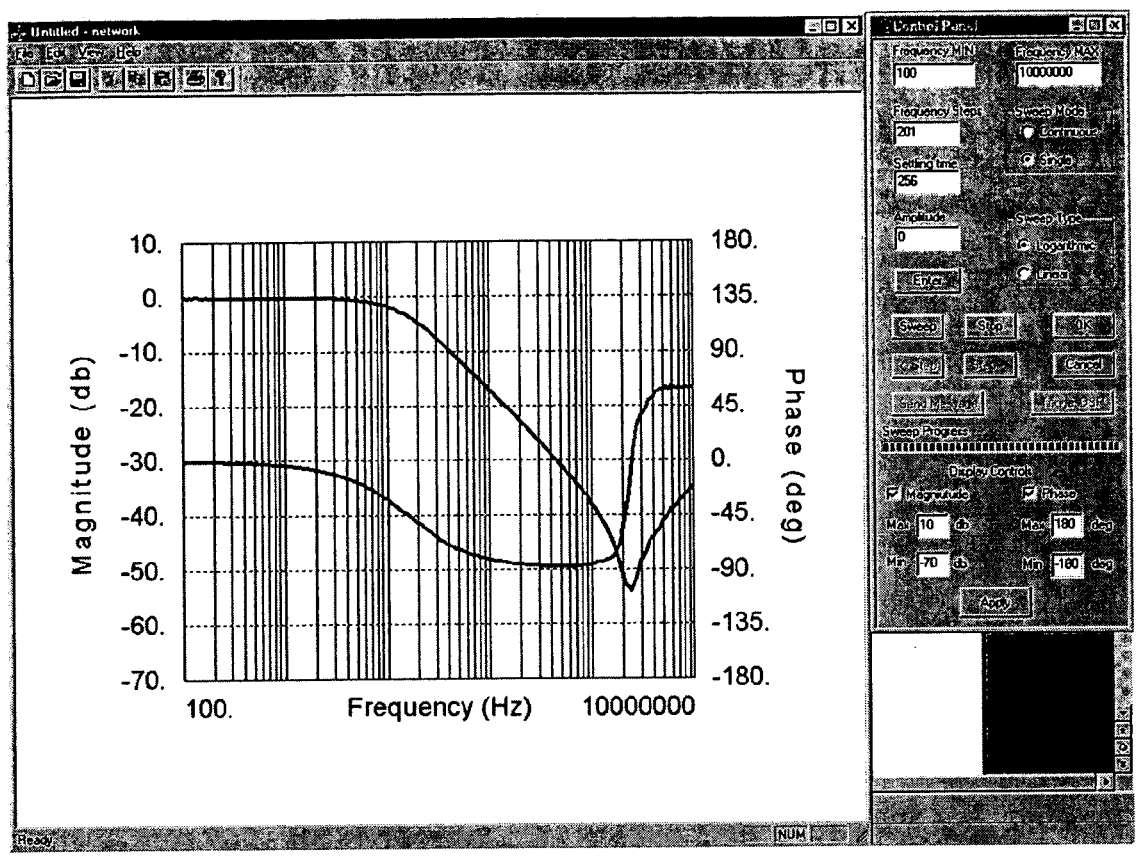
FIG. 1 illustrates the transfer function output showing relative magnitude and phase of a low pass filter.

The analyzer of the present invention can be controlled via software loaded on a personal computer and displayed in control elements on the computer screen. FIG. 1 illustrates an example of controls and displays in accordance with the present invention. The controls may be classified into three groups: test parameter controls, data acquisition controls, and display controls. These controls are in addition to standard file commands such as those required to open, close and save files.

The present invention allows the user to set the parameters over which the test is to be performed. Frequency range is controlled by setting a minimum and a maximum value of the stimulus frequency, the amplitude of the stimulus frequency, the number of frequency increments over the test range, a linear or logarithmic frequency progression, continuous or single frequency sweep and a parameter to delay the start of the measurement, for a given time, to allow for the circuit or system to settle or come to a steady state value after a change in stimulus frequency.

A number of controls are available to begin the acquisition and, if necessary, to interact with the analyzer during the test. An 'Enter' control locks in the test parameters. A 'Start' control starts the acquisition. A 'Stop' control may stop the acquisition at any time. There is a 'Continuous' sweep mode control that allows repeated tests over the frequency range. There is a 'Single' sweep control that allows only one test over the frequency range. There is a progress indicator that shows the state of the test as the system steps through each frequency.

The on screen display is updated with a graphical representation of the test results at the completion of each sweep. The user has full control over the data that is to be displayed. A transfer function or frequency response is best displayed as the ratio of the output signal to the input signal (relative magnitude in decibels) vs. frequency, preferably with the magnitude scale on the left side of the graph. Additionally, the phase of the output signal minus the input signal (or relative phase) vs. frequency may be displayed as well on the same graph but with the scale on the opposite side (e.g., the right hand side) of the graph as that of the magnitude scale. Controls are provided to select phase or magnitude or both with independent scaling of each of the axes. The example test illustrated was performed on a low pass filter with a cutoff frequency (−3 db) of approximately 15 Khz.

The analyzer hardware of the present invention interfaces with a personal computer via standard communications. Among communications protocols are RS-232 or standard serial communications, Universal Serial Bus (USB) and ETHERNET. This eliminates the need for additional internal computer hardware, for instance, a data acquisition card or SCSI controller card. Software utilizes the standard personal computer hardware to control data acquisition from the external hardware and also eliminates the need to purchase additional software to control and process the data.

Figure 2:
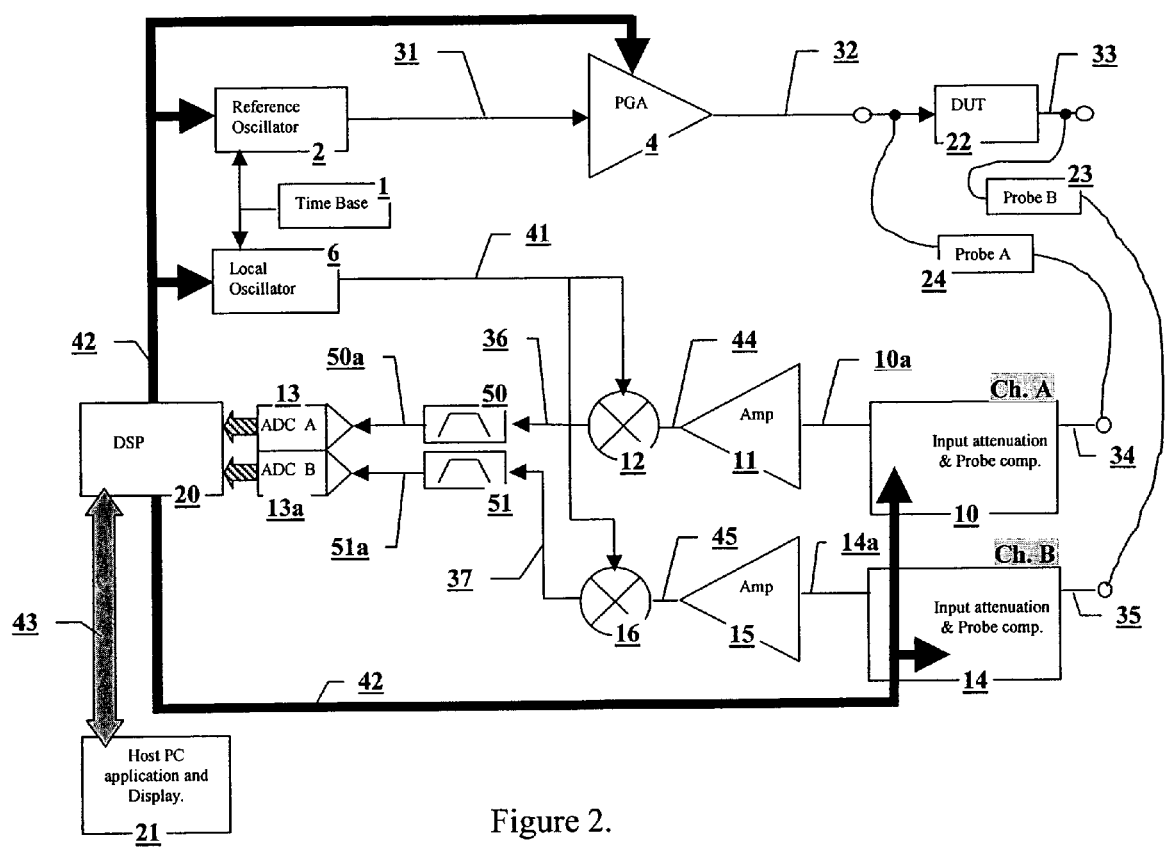
FIG. 2 is a block diagram of the external acquisition hardware and its interface to a personal computer.

The acquisition hardware of the present invention is externally connected to the host computer, via a standard communications interface. It is controlled by the host application and display software. All data acquisition and pre-processing of the measurement data is performed by the acquisition hardware. An example of acquisition hardware in accordance with the present invention is illustrated in FIG. 2 and comprises:

an embedded microcontroller or digital signal processor (DSP) 20 connected to a personal computer 21 via standard communication interface 43 (RS-232, USB, Ethernet, etc.), to interpret and distribute commands received from the personal computer to the hardware to be controlled, to control the acquisition of the data, to pre-process the measurement data, to transmit the results of the pre-processed data to the personal computer for final processing and display;

a digitally controlled signal source 2 communicating with the microcontroller or DSP, to provide a digitally synthesized, frequency stable, spectrally pure, sine wave reference signal;

a programmable gain amplifier 4 communicating with the microcontroller or DSP connected to the output of the reference generator 2, to provide an output signal to a device under test (DUT) 22 at a fixed gain setting over the test frequency range or at a number of gain settings pre-determined by the user or automatically by the system;

a digitally controlled signal source 6 communicating with the microcontroller or DSP, to provide a digitally synthesized, frequency stable, spectrally pure, sine wave local oscillator signal, it's frequency dependant on, but not equal to, the frequency of the reference oscillator by a pre-determined scale factor or additive term;

a crystal controlled oscillator 1 providing a common timebase for the reference oscillator 2 and the local oscillator 6;

two separate input circuits, each comprising:

a programmable attenuator 10, 14 communicating with the microcontroller or DSP, for measuring signals from the DUT 22, to provide compensation circuitry for standard 1× or 10× oscilloscope probes 23, 24 to provide selectable attenuation that effectively increases the dynamic range of the input stage;

a high bandwidth, high input impedance amplifier 11, 15 connected to the output of the input attenuator circuit to amplify the signal to be measured;

a mixer or down converting stage 12, 16 that multiplies the signal to be measured by the local oscillator frequency to provide a signal representative of the signal to be measured at a fixed intermediate frequency (IF);

a fixed bandpass filter 50, 51 to remove any DC component from the IF signal and to provide high frequency filtering prior to analog-to-digital conversion;

an analog-to-digital converter (ADC) 13, 13a controlled by the microcontroller or DSP, to sample the output of the fixed bandpass filter, to transmit the resulting digital signal to the microcontroller or DSP.

A central aspect of the acquisition hardware is the embedded digital signal processor 20 (DSP), which can comprise, for example, an ADSP2181 DSP. It is the central communication and data processing point of the system. The DSP 20 interprets and distributes all commands from the computer 21, pre-processes the measurement data, and transmits the data to the computer. The DSP is in communication with the computer 21 as the test progresses.

A test is comprised of a set of measurement points over a corresponding set of frequency points, the number of points being determined by the user. Measurements are made for both channels A and B at each test frequency. Channel A is the signal to be measured at the input of the DUT and Channel B is the signal to be measured at the output of the DUT. Channels A and B are measured simultaneously at each test frequency, beginning at the user determined minimum test frequency, stepping through and making a measurement at each successive test frequency, then ending at the user determined maximum test frequency. Since the measurement method is identical for each test frequency, the system is best described by following the circuit through at a single test frequency.

For each measurement taken, the computer 21 sends a data packet of test information to the acquisition hardware via standard communication interface 43 as mentioned. The data packet can comprise the frequency information for the reference oscillator 2, the frequency information for the local oscillator 6, the output amplitude information for the programmable gain amplifier 4, settling time information that provides a time delay, via embedded DSP 20 software, prior to the actual measurement to allow the DUT 22 to settle after a change of frequency, and information for programming the input attenuators 10, 14. The DSP 20 interprets each piece of test information and electrically communicates that information to the appropriate circuitry.

In a preferred embodiment direct digital synthesis was used for the design of the sine wave oscillators. The technique utilizes numerically controlled oscillators to digitally produce frequency stable and spectrally pure sine waves whose frequency is scaled to a crystal controlled timebase. This technique realizes fine resolution of the oscillators to a fraction of a cycle depending on the frequency of the crystal timebase. The reference oscillator and the local oscillator can each comprise AD9580 oscillators manufactured by Analog Devices. A 125 Mhz crystal timebase provides a theoretical frequency resolution of 0.0291 Hz and a theoretical frequency range of 62.5 Mhz. The present system restricts the frequency resolution to 0.1 Hz and the range to 50 Mhz. It can also be seen that a frequency multiplier system, connected to each oscillator, could be utilized to extend the frequency range of the system to 100 Mhz or 200 Mhz or greater, thereby taking advantage of the frequency stability of the crystal oscillator.

Programming information representative of the reference frequency is sent to the reference oscillator 2 and programming information representative of the local oscillator frequency is sent to the local oscillator 6 via a data bus 42. Local oscillator 6 is programmed to produce a frequency that is 4900 Hz higher than the reference oscillator 2. 4900 Hz is a pre-determined intermediate frequency that is constant throughout the test and for the present system and is not user programmable. The local oscillator 6 tracks the reference oscillator 2 to maintain the difference of 4900 Hz throughout the entire test and provide an output signal 41.

Programming information representative of the user defined output amplitude is sent to the programmable gain amplifier (PGA) 4 via a data bus 42. The PGA 4 takes as its input the reference signal 31, and provides at it's output, the stimulus signal 32, for DUT 22 at the amplitude and frequency for which the measurement is to take place. The PGA provides the option of adjusting each stimulus frequency amplitude over the test range. This facilitates some audio testing where the amplitude of the test frequency is logarithmically decreased as the frequency increases.

Programming information representative of the user defined input attenuation is sent to the input attenuators 10, 14 via a data bus 42. Programming information representative of the user defined settling time is held within the memory of the DSP 20 and referenced to upon receiving a trigger signal from the computer.

Probe A 24 is connected to the signal at the DUT input 32 and presents the signal to be measured 34 to the channel A input attenuation 10, and probe B 23 is connected to the DUT output 33 and presents the signal to be measured 35 to the channel B input attenuation 14.

Programmable input attenuation is provided to allow attenuation of high level signals such that they do not saturate the input stages and corrupt the measurement. Software can be provided to test the level of the input signal prior to the measurement and make the appropriate attenuation adjustments to ensure a reliable measurement. The attenuators are independent of one another such that each one may be independently programmed with different attenuation values, if necessary. Oscilloscope probe compensation is necessary in the case where standard 10× scope probes are used for extended bandwidth. The scope probe compensation is designed such that it presents a very high input impedance and small capacitive load to the signal to be measured to insure an accurate measurement.

Input attenuator A output signal 10a is presented to input amplifier 11 and input attenuator B output signal 14a is presented to input amplifier 15. Input amplifiers 11, 15 are high frequency, high input impedance amplifiers designed such that they do not present a significant loading effect to the signals to be measured, amplify the signals to be measured, and output amplified signals 44, 45 to the following mixer stage. One example of amplifiers that may be used are Burr-Brown/Texas Instruments amplifiers, part # OPA655. It should be noted that any amplifier that possesses the above characteristics may be used by any design technique whether it is a single amplifier or a circuit comprised of many discrete parts.

Analog mixer 12, provides output signal 36 by mixing the local oscillator signal 41 with the amplified channel A signal 44. Analog mixer 16 provides output signal 37 by mixing the local oscillator signal 41 with the amplified channel B signal 45.

Mixing is similar to a down converting or multiplication operation. The output signal of each mixer has a frequency content equal to the local oscillator frequency plus the frequency of the signal to be measured (sum), and the local oscillator frequency minus the frequency of the signal to be measured (difference). In a test embodiment the inventive system was designed such that the difference frequency is constant for the entire test and is equal to the intermediate frequency of 4900 Hz. This is a result of the local oscillator tracking the reference oscillator by a frequency equal to the intermediate frequency. Each signal to be measured is down converted to the intermediate frequency of 4900 Hz. The amplitude and phase of the signal to be measured is preserved in the down conversion. A four quadrant analog mixer (e.g., an Analog Devices AD834) was chosen because pure multiplication of two sin wave signals ideally yield only the sum and difference signals. Mixing down to an intermediate frequency allows AC signal coupling between stages which minimizes errors due to DC and low frequency drift. The value of the intermediate frequency was chosen such that high quality, cost effective, 16-bit (or greater) analog-to-digital converters may be used to sample the measurement data with high dynamic range.

The output signal from the mixer along the channel A path 36 is presented to fixed bandpass filter 50 and the output signal from the mixer along the channel B path 37 is presented to fixed bandpass filter 51.

The bandpass filters are designed to remove any DC or low frequency component from the intermediate frequency and to provide high frequency filtering or anti-aliasing, prior to analog-to-digital conversion.

The output signal from the bandpass filter along the channel A path 50a is presented to analog-to-digital converter 13 and the output signal from the bandpass filter along the channel B path 51a is presented to analog-to-digital converter 13a. Each Analog-to-digital converter is in communication with the DSP 20.

The analog-to-digital converters (ADC) can comprise Analog Devices, part # AD1847. A high quality, dual ADC is preferred because it possesses similar characteristics being manufactured on the same die as opposed to two separate ADCs whose characteristics, such as input offset voltage and gain error, could be significantly different although within manufacturer's specification. The present system uses a relative measurement process where minimal differences between converters is desirable. Additionally, an oversampling, or sigma-delta, ADC is preferred because signal processing is performed within the ADC that allows the use of low cost, simple filtering at the input of the ADC.

When a trigger command is transmitted from the computer 21 to the DSP 20, the system delays the acquisition of samples for a period of time equal to a user determined settling time. As mentioned, the settling time had been transmitted with the frequency and amplitude packet of information prior to the trigger command. When the settling time expires, the acquisition begins at a sample rate of 44100 Hz. Sampling theory states that the sampling frequency must be at least twice that of the maximum bandwidth of the signal to be sampled. A sampling frequency of 44100 Hz is a standard audio frequency sampling rate, and is nine times that of the 4900 Hz intermediate frequency signal. It is noted that the use of a 4900 Hz intermediate frequency and a 44100 Hz sample rate was selected for this particular implementation. Any intermediate frequency or sample rate may be used and still fall within the scope of the present invention.

Figure 3:
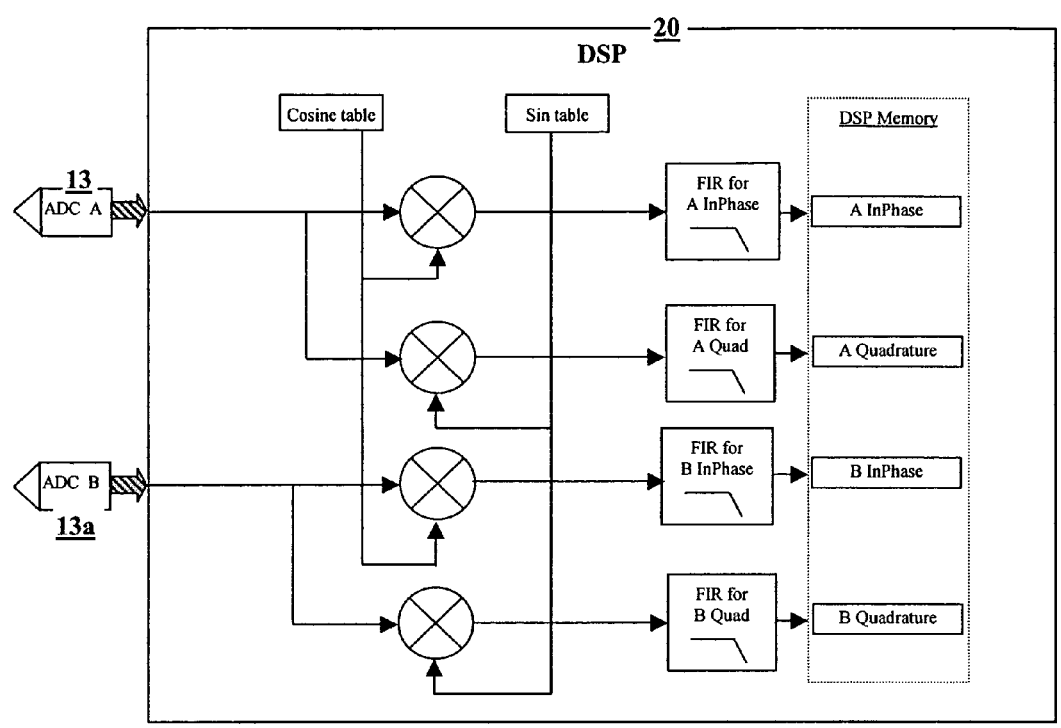
FIG. 3 is a block diagram of the internal DSP operations on channels A and B.
Figure 4:
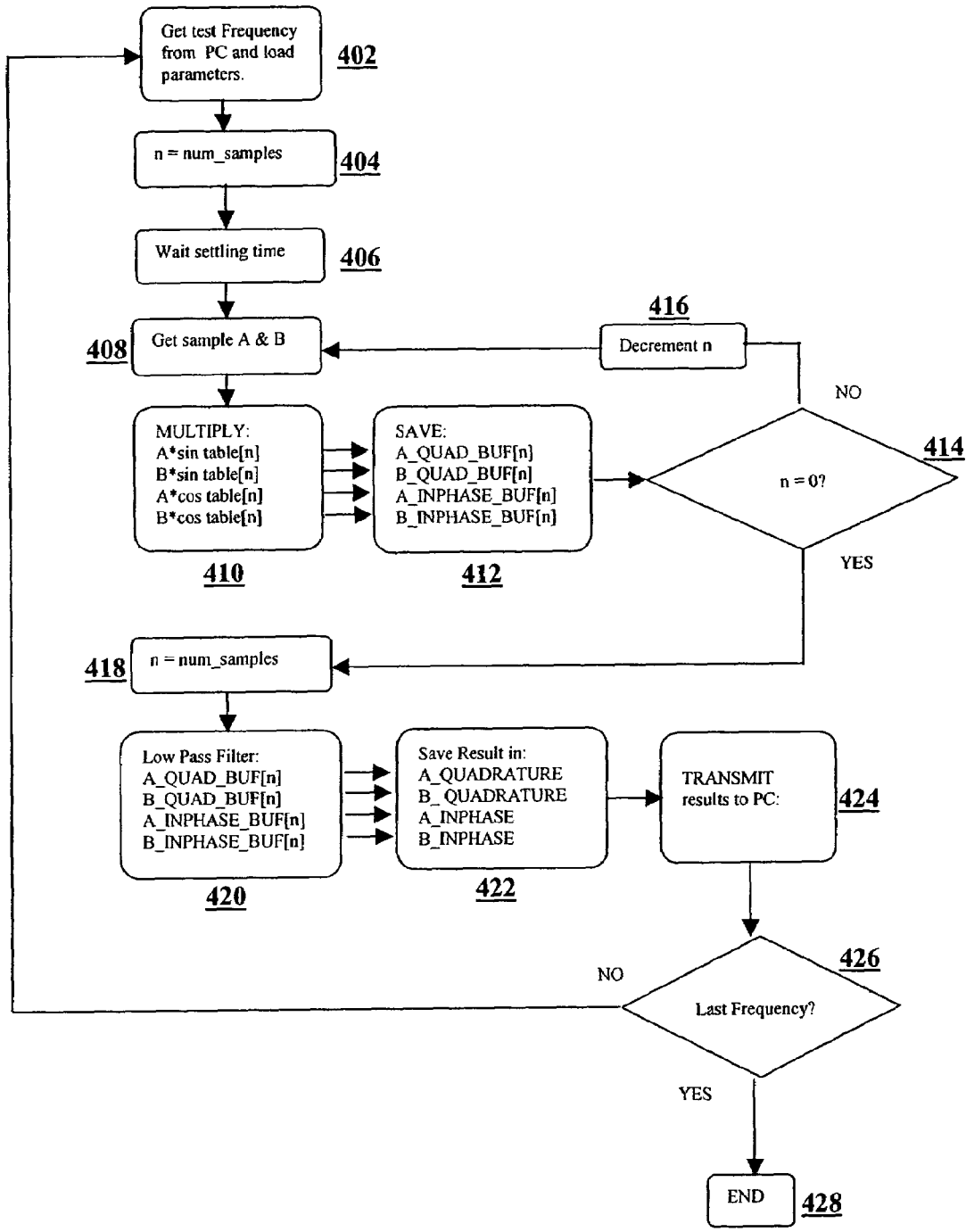
FIG. 4 is a flow diagram that illustrates the process of making a measurement at each frequency.

Channels A and B had been previously down converted to the intermediate frequency of 4900 Hz and may be treated as complex vectors with real and imaginary components, inphase and quadrature respectively. FIG. 3 is a block diagram that helps in understanding some of the digital signal processing of the present invention. The mixing or heterodyne stage is digitally implemented within the DSP 20 to extract the inphase and quadrature components of vectors A and B. A digital representation of the sin and cosine of the intermediate frequency (4900 Hz) is stored in a lookup table within the DSP memory. Each sample of channel A is multiplied by a sample of the sin and cosine of the digital intermediate frequency signal, and each sample of channel B is multiplied by a sample of the sin and cosine of the digital intermediate frequency signal. This operation yields four separate outputs, two for each vector. Each output signal has a frequency content equal to the intermediate frequency plus the frequency of the signal to be measured (sum), and the intermediate frequency minus the frequency of the signal to be measured (difference). For this case, the sum frequency is 9800 Hz and the difference is 0 Hz. Each output is digitally filtered to extract the difference frequency, using, for example, finite impulse response (FIR) techniques creating the vector components, A inphase, A quadrature, B inphase and B quadrature. The four numerical values, A inphase, A quadrature, B inphase and B quadrature are transmitted back to the computer 21 and saved as measurement values. It is noted that any digital filtering technique may be used and still fall within the scope of the present invention.

The above is repeated for each frequency in the test. When the test is complete, the computer performs calculations that are consistent with the method that the user has selected for display of the data on the computer screen, or for exporting the data into a format that can be used in a spreadsheet or other data analysis process. As an example calculation, the magnitude and phase of vector A may be calculated:

$$|A| = \sqrt{((AInPhase)^2 + (AQuadrature)^2)}$$
$$\angle A = \tan^{-1}\left[\frac{AQuadrature}{AInPhase}\right]$$

Likewise for vector B:

$$|B| = \sqrt{((BInPhase)^2 + (BQuadrature)^2)}$$
$$\angle B = \tan^{-1}\left[\frac{BQuadrature}{BInPhase}\right]$$

Let the transfer function of the DUT equal T.

The log magnitude of the transfer function, or the output divided by the input of the DUT, in decibels, is equal to:

$$|T| = 20\text{Log}\left(\frac{|B|}{|A|}\right)$$

The phase angle of the transfer function of the DUT is equal to:

$$\angle T = \angle B - \angle A$$

An example of the results of such a test is shown in FIG. 1.

At step 402, the embedded processor loads the information from it's internal memory to program the appropriate hardware, for example reference oscillator 2, local oscillator 6, PGA 4 etc., with the test parameters required for that particular frequency in the test sequence.

At step 404, the number of time samples that the ADC 13, 13a will acquire is loaded from the num_samples counter into the variable, n.

At step 406, the system waits for a given time (set in step 402) before starting the acquisition of data to allow the DUT to recover, if necessary, from the change in reference frequency.

At step 408, the system acquires a single time sample of each channel, A and B simultaneously.

At step 410, the sample of channel A is multiplied by a sample of the sin and cosine of the digital intermediate frequency signal, and the sample of channel B is multiplied by the same sample of the sin and cosine of the digital intermediate frequency signal. This operation yields four separate results as shown.

At step 412, the four separate results of step 410 are stored in four separate sequential memory spaces.

At step 414, the program checks to see if the last sample has been taken. If YES, the program moves on to process the samples or if NO, the program moves on to step 416.

At step 416, the program decrements n proceeds back to step 408 to get the next time sample.

At step 418, the program loads n with the contents of the num_samples register to initialize the filtering process.

At step 420, the program low pass filters the data stored in each sequential memory space.

At step 422, the results of each of the four filtering processes, A inphase, A quadrature, B inphase and B quadrature are stored in memory.

At step 424, the four numerical values, A inphase, A quadrature, B inphase and B quadrature are transmitted back to the computer 21 and saved as measurement values.

At step 426, the programs checks to see if the last frequency in the test sequence has been reached. If NO, the program returns to step 402, if YES the program proceeds to step 428.

At step 428, the test sequence ends and the acquisition hardware returns to an idle mode awaiting further instructions from the PC.

The above-described steps can be implemented using standard well-known programming techniques. The novelty of the above-described embodiment lies not in the specific programming techniques but in the use of the steps described to achieve the described results. Software programming code which embodies the present invention is typically stored in permanent storage of some type, such as permanent storage of a workstation located in the sine wave analysis system itself. In a client/server environment, such software programming code may be stored with storage associated with a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems. The techniques and methods for embodying software program code on physical media and/or distributing software code via networks are well known and will not be further discussed herein.

It will be understood that each element of the illustrations, and combinations of elements in the illustrations, can be implemented by general and/or special purpose hardware-based systems that perform the specified functions or steps, or by combinations of general and/or special-purpose hardware and computer instructions.

These program instructions may be provided to a processor to produce a machine, such that the instructions that execute on the processor create means for implementing the functions specified in the illustrations. The computer program instructions may be executed by a processor to cause a series of operational steps to be performed by the processor to produce a computer-implemented process such that the instructions that execute on the processor provide steps for implementing the functions specified in the illustrations. Accordingly, the figures support combinations of means for performing the specified functions, combinations of steps for performing the specified functions, and program instruction means for performing the specified functions.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

The invention claimed is:

1. A network analyzer, couplable to a processing device, for testing a device-under-test (DUT), comprising:
   a control processor couplable to said processing device via an interface of said processing device;
   a first signal source in communication with said control processor providing a reference signal of a first frequency;
   a gain stage in communication with said control processor and receiving said reference signal, providing an output signal to said DUT at at least one predetermined gain value;
   a second signal source in communication with said control processor, outputting a local oscillation signal of a second frequency, said second frequency being offset from said first frequency by a predetermined fixed amount;
   a time base oscillator coupled to said first and second signal sources, providing a common time base for said first and second signal sources; and
   first and second input circuits, each comprising:
   a programmable attenuator in communication with said control processor measuring signals associated with said DUT;
   a signal amplifier, connected to said programmable attenuator, amplifying the measured signals associated with said DUT; and
   a mixer, coupled to said signal amplifier and receiving said local oscillation signal, multiplying the measured signals by the local oscillation signal, thereby providing a signal translated down to a fixed intermediate frequency.

2. The network analyzer of claim 1, wherein said first signal source and said second signal source each comprise digitally synthesized signal sources.

3. The network analyzer of claim 1, wherein said second signal source tracks said first signal source to maintain the offset at said predetermined fixed amount.

4. The network analyzer of claim 3, wherein said second frequency is higher than said first frequency.

* * * * *